United States Patent
Kling

(10) Patent No.: US 6,549,152 B1
(45) Date of Patent: Apr. 15, 2003

(54) 1-BIT DIGITAL-ANALOG CONVERTER TO CONVERT DIGITAL INFORMATION INTO CURRENT AND VOLTAGE PULSES

(75) Inventor: Helmut Kling, Elchingen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/937,341

(22) PCT Filed: Mar. 22, 2000

(86) PCT No.: PCT/DE00/00886

§ 371 (c)(1),
(2), (4) Date: Sep. 24, 2001

(87) PCT Pub. No.: WO00/57558

PCT Pub. Date: Sep. 28, 2000

(30) Foreign Application Priority Data

Mar. 22, 1999 (DE) .......................................... 199 12 827

(51) Int. Cl.[7] .................................................. H03M 1/66
(52) U.S. Cl. ...................... 341/144; 341/143; 341/118; 341/131; 341/172; 341/155
(58) Field of Search ................................ 341/143, 144, 341/153; 327/11, 374, 434, 436, 437, 143; 345/20, 22, 589, 600

(56) References Cited

U.S. PATENT DOCUMENTS

| | | | | |
|---|---|---|---|---|
| 5,489,903 A | * | 2/1996 | Wilson et al. ............... | 341/144 |
| 5,638,011 A | | 6/1997 | Nguyen | |
| 5,712,635 A | * | 1/1998 | Wilson et al. ............... | 341/144 |
| 5,790,060 A | * | 8/1998 | Tesch .......................... | 341/119 |
| 5,982,317 A | * | 11/1999 | Steensgaard-Madsen .... | 341/144 |
| 6,040,793 A | * | 3/2000 | Ferguson et al. ............ | 341/172 |
| 6,087,969 A | * | 7/2000 | Stockstad et al. ........... | 341/155 |
| 6,087,970 A | * | 7/2000 | Panicacci .................... | 341/172 |
| 6,255,975 B1 | * | 7/2001 | Swanson ..................... | 341/143 |
| 6,268,815 B1 | * | 7/2001 | Gustavsson et al. ........ | 341/143 |
| 6,351,229 B1 | * | 2/2002 | Wang .......................... | 341/131 |
| 6,359,576 B1 | * | 3/2002 | Petrofsky .................... | 341/118 |
| 6,362,761 B1 | * | 3/2002 | Bonardi et al. ............. | 341/143 |
| 6,369,735 B1 | * | 4/2002 | Yang .......................... | 341/144 |

FOREIGN PATENT DOCUMENTS

| | | |
|---|---|---|
| DE | 4315299 C1 | 6/1994 |
| DE | 3852740 T2 | 8/1995 |
| EP | 0308008 B1 | 1/1995 |

OTHER PUBLICATIONS

G. Cervelli et al., "A Low Noise CMOS Preamplifier for Analog Electro–Optical Fibre Links", CH–1211 Geneva 23, Switzerland.

(List continued on next page.)

*Primary Examiner*—Michael Tokar
*Assistant Examiner*—Lam T. Mai
(74) *Attorney, Agent, or Firm*—Staas & Halsey LLP

(57) ABSTRACT

A 1-bit digital-analog converter has outputs, switching units and pulse shaping units, with outputs, switching unit and the pulse shaping units being decoupled from one another by decoupling units. In addition, a 1-bit digital-analog converter has one or two outputs, two inputs, a switching unit and pulse shaping units, with each input being produced in a pair, and for each switching unit a second switching unit is arranged such that each bit change of the input bit fundamentally forces a switching operation. In addition, in the case of the current circuit i, the current i is regulated to virtually or actually zero, while in the case of the voltage circuit the corresponding voltage difference is regulated to virtually or actually zero.

32 Claims, 5 Drawing Sheets

OTHER PUBLICATIONS

Teddy Loeliger et al., "Cascode Circuits for Switched Current Copiers", Electronics Laboratory, Swiss Federal Institute of Technology, Zurich, Switzerland.

Niklas U. Andersson et al., A Strategy for Implementing Dynamic Element Matching in Current–Steering DACs, Microelectronics Research Center, Ericsson Components AB, SE–164 81 Kista Sweden, Department of Electrical Engineering, Linköping University, SE–581 83 Linköping, Sweden.

Kammeyer et al., "Nachrichtenübertragung", ISBN 3–519–16142–7, B.G. Teubner Stuttgart 1996, pp. 134–137.

Jensen, et al., "A 3.2–GHz Second–Order Delta–Sigma Modulator Implemented in InP HBT Technology", 8107 IEEE Journal of Solid–State Circuits, vol. 30, No. 10, Oct. 1995, New York, US, pp. 1119–1127.

Miwa et al., "High Speed Data Output Circuit Technoques for a 17 ns 4 Mbit BiCMOS DRAM", 2334c IEICE Transactions on Electronics, vol. E75–C, No. 11, Nov. 1992, Tokyo, JP, pp. 1344–1349.

Jayaraman et al., "Linear High–Efficiency Microwaver Power Amplifiers Using Bandpass Delta–Sigma Modulators", IEEE Microwave and Guided Wave Letters, vol. 8, No. 3, Mar. 1998, XP–000734894, pp. 121–123.

Weinan et al., "A 950–MHz IF Second–Order Integrated LC Bandpass Delta–Sigma Modulator", Journal of Solid–State Circuits, vol. 33, No. 5, May 1998, pp. 723–732.

* cited by examiner

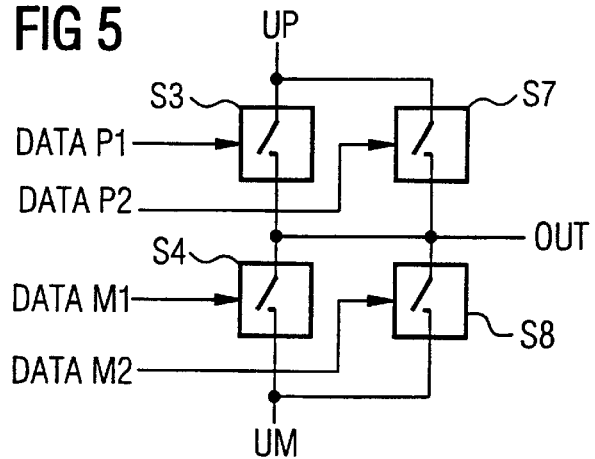
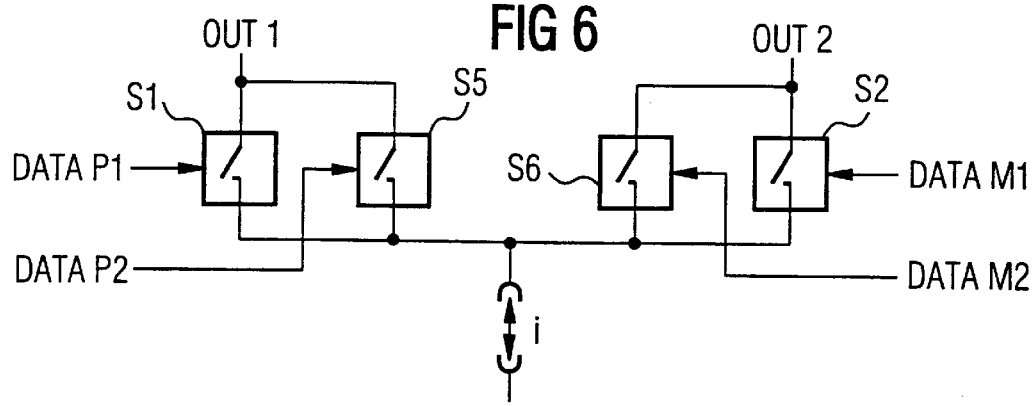
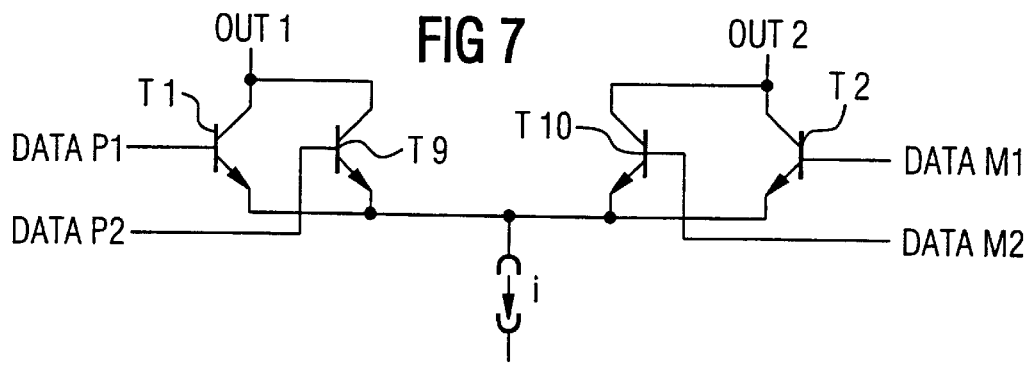

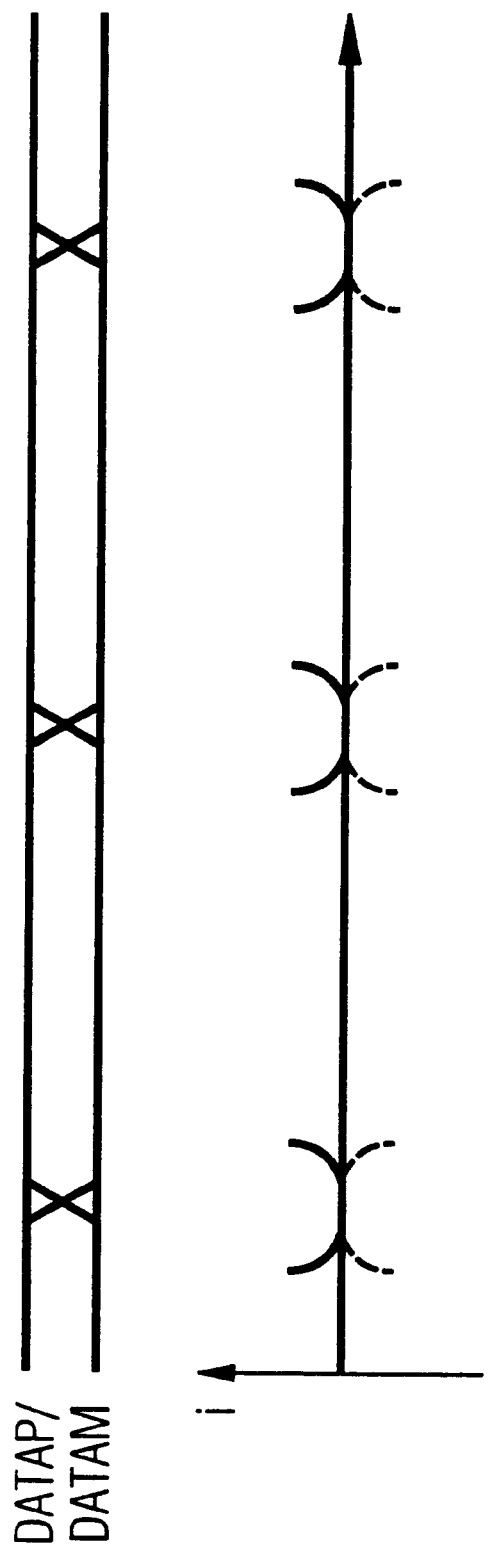

1-BIT DIGITAL-ANALOG CONVERTER TO CONVERT DIGITAL INFORMATION INTO CURRENT AND VOLTAGE PULSES

CROSS REFERENCE TO RELATED APPLICATIONS

This application is based on and hereby claims priority to PCT Application No. PCT/DE00/00886 filed on Mar. 22, 2000 and German Application No. 199 12 827.8 filed on Mar. 22, 1999 in Germany, the contents of which are hereby incorporated by reference.

BACKGROUND OF THE INVENTION

The invention relates to high resolution digital-analog converters based on the principle of sigma-delta modulation, as are able to be used in multistandard or multicarrier base transceiver stations ("Software Radio"). In addition, such converters are suitable for all technical problems faced in which 1-bit quantized digital signals need to be converted into analog signals.

The task of such a 1-bit digital-analog converter is to convert digital input values, namely—1 and +1, into analog voltage or current pulses. Such 1-bit digital-analog converters are based on delta modulation, which can be regarded as a special case of differential pulse code modulation. Ideally, this should produce pulses whose waveforms are absolutely identical over the duration of one bit and which differ only in terms of their polarity. A typical application of such 1-bit digital-analog converters is in the field of DS digital-analog converters (DS—delta sigma) and DS digital-analog converters. In the case of the DS digital-analog converter, the frequency used to sample a band-limited signal is increased to a multiple of twice the bandwidth, and the word length of the samples is reduced to up to 1-bit. In the converse case of the DS digital-analog converter, a 1-bit data stream is produced and is then supplied to a 1-bit digital-analog converter in the corresponding case. The output of the digital-analog converter then produces a spectrum which corresponds to the digital input spectrum within a frequency band of interest.

This is illustrated, by way of example, in K. D. Kammeyer "Nachrichtenübertragung", B. G. Teubner, Stuttgart 1996, ISBN 3-519-16142-7, pages 134 ff. A prerequisite for the analog output spectrum to correspond to the digital input spectrum within a frequency band of interest is that the integral of an output pulse is of identical magnitude for all pulses and has a negative or positive arithmetic sign merely on the basis of the polarity of the digital input value. This means, in particular, that the pulse integral can be dependent only on the digital input value and not on the previous digital history. For converters having a high dynamic range, even small asymmetries in the positive and negative pulses must therefore likewise be prevented, such as the smallest influences of the preceding data bit, which are referred to as memory effects.

The printed publication "A 3.2-GHz Second-Order Delta-Sigma Modulator implemented in InP HBT Technology", IEEE J. of Solid-State Circuits, US, Vol. 30, No. 10, October 1995, pp. 1119–1127 discloses a 1-bit digital-analog converter whose signal unit $I_{DAC}$ is decoupled from a switching unit (transistors with switching signals DAC input) by means of a cascade.

U.S. Pat. No. 5,638,011 discloses a 1-bit digital-analog converter whose switching unit Q2 is decoupled from the signal unit, which is formed by Q1, and from the output, formed by Q3, by means of a cascade.

FIGS. 9A, 9B and 10A, 10B show customary circuit designs for 1-bit digital-analog converters described, by way of example, in Jayaraman et al., "Linear High-Efficiency Microwave Power Amplifiers Using Bandpass Delta-Sigma Modulators", IEEE Microwave and Guided Wave Letters, Vol. 8, No. 3, March 1998, pp. 121–123, and in W. Gao and W. M. Snelgrove, "A 950-MHz IF Second-Order integrated LC Bandpass Delta-Sigma Modulator", IEEE J. Solid-State Circuits, Vol. 33, No. 5, May 1998, pp. 723–732.

Thus, FIG. 9A shows a 1-bit digital-analog converter circuit in which a sequence of current pulses which is produced by a current pulse shaping unit or else a constant current i is switched by a switching unit, comprising the switches S1 and S2, to the positive or negative output path OUT1, OUT2 of a differential current output under the control of a differential digital input signal DATAP, DATAM. FIG. 9B shows a simple embodiment of the circuit shown in FIG. 9A, in which the two switches S1, S2 are produced by two transistors T1, T2. In the design shown in FIG. 10A, the voltage output OUT is switched to the voltage UP or UM, again under the control of differential digital input signals DATAP and DATAM. In full analogy to the design shown in FIG. 9A, the voltages UP and UM may be constant or else may have a prescribed pulse shape.

In the circuits shown in FIGS. 9A and 9B and likewise in 10A and 10B, the fact that the components used are not ideal means that the outputs interact, which goes against the demands on a 1-bit digital-analog converter which were expressed at the outset.

Explained in more detail, the way in which the circuit design shown in FIG. 9A works is based on the feature that a supplied current i is switched to the positive or negative input path OUT1 or OUT2 of a differential current output using a current switch S1, S2 on the basis of the polarity of the differential digital input signal DATAP or DATAM. In this context, the input current i can assume a constant value, an "NRZ pulse", or else may have an already preshaped pulse shape. To keep down the effects of variations in the transistor properties or switch properties, cf. FIG. 9B, namely offset voltages, the balanced state of the switching transistors T1 and T2 should be quickly passed through, as is normal for switch operation. This means that it is not advisable to shape the output pulse using the two inputs. An inherent drawback of the design is therefore that, by way of example, a digital "+1" following the digital value "−1" is assessed differently than a digital "+1" which has likewise been preceded by a "+1". In the first case, a changeover operation takes place in the current switch S1 or S2, which is inevitably associated with crosstalk effects and switching transients on account of the switching transistors T1, T2 not being ideal, while in the second case no kind of switching operation is triggered and such effects therefore do not arise. This results in a design-related asymmetry in the response of the digital-analog converter. This property, which is shown using FIG. 9B, is likewise possessed by the circuit shown in FIGS. 10A and 10B, should be apparent.

One aspect of the invention is therefore based on the object of providing a 1-bit digital-analog converter whose asymmetric properties are reduced.

This means that very slight influences from previous control bits of a switching unit used are not meant to have any influence on the output signal, and the memory effect, which is so called for this reason, is meant to be prevented. Alternatively, interaction, caused by the fact that the components used are not ideal, is meant to be prevented. If pulses are produced as output signals, then their waveform over the duration of one bit is meant to be absolutely identical, that is to say that when an integral of an output pulse is formed, the value of the integral is meant to be of identical magnitude for all pulses. Even small asymmetries in the pulses are meant to be prevented.

SUMMARY OF THE INVENTION

One aspect of the present invention relates to 1-bit digital-analog converters having two inputs, one or two outputs, switching units and one or two pulse shaping units, with outputs, switching unit and the pulse shaping units being decoupled from one another by decoupling units. Such decoupling units can be formed by cascade isolation stages, with the cascade isolation stages being formed by transistors T5, T6, T7. Preferably, the cascades are operated with a bias current, in which case alternate changeover of the constant currents can be provided in a dynamic element matching stage.

One aspect of the present invention also relates to a 1-bit digital-analog converter having one or two outputs, two inputs, a switching unit and one or two pulse shaping units, where each input is produced in a pair, and for each switching unit a second switching unit is produced such that each bit change of the input bit fundamentally forces a switching operation.

In addition, fundamentally, precisely one of the inputs is at an "H" level and precisely three inputs are at an "L" level for the duration of one bit in the 1-bit digital-analog converter.

Finally, the switching elements in the 1-bit digital-analog converter are formed by transistors.

In addition, in a 1-bit digital-analog converter having one or two outputs, two inputs, a switching unit and one or two pulse shaping units, in the case of a current circuit, the current i from the pulse shaping unit is switched, during a switching operation of the data inputs, to a constant value which cannot be influenced by the data sequence, and in the case of a voltage circuit, the corresponding voltage difference of the pulse shaping unit is switched, during a switching operation of the data inputs, to a constant value which cannot be influenced by the data sequence.

Preferably, in the case of the current circuit i, the current i assumes the value 0, and in the case of the voltage circuit the corresponding voltage difference assumes the value 0.

Advantageously, the circuit forms of the 1-bit digital-analog converters are used in digital-analog converter circuits for a longer word length.

Advantageously, the circuit forms of the 1-bit digital-analog converters are also used in n-bit converter circuits, for example 1.5-bit converters. Such converters switch an output current to a positive output, a negative output or, by way of example, a positive supply voltage on the basis of a logic input value which can assume the states +1, −1 and 0.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 5 shows a second embodiment of a 1-bit digital-analog converter for converting digital information into voltage pulses, FIG. 6 shows the current circuit variant of the second embodiment of a 1-bit digital-analog converter for converting digital information into current pulses, FIG. 7 shows an implementation of the circuit diagram shown in FIG. 6, FIG. 8 shows a schematic illustration of the current regulation during a switching operation of a third embodiment.

Figure 9A:
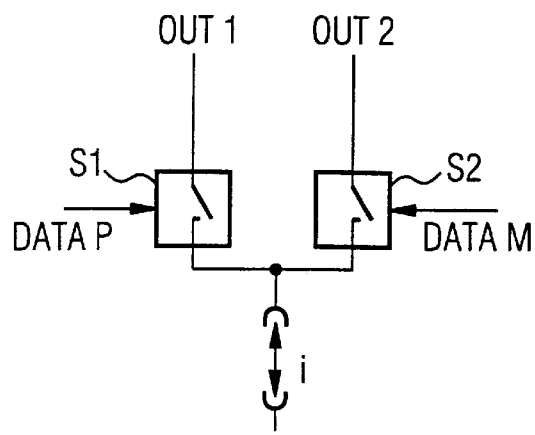
FIGS. 9A and 9B show a known 1-bit digital-analog converter for converting digital information into current pulses.
Figure 9B:
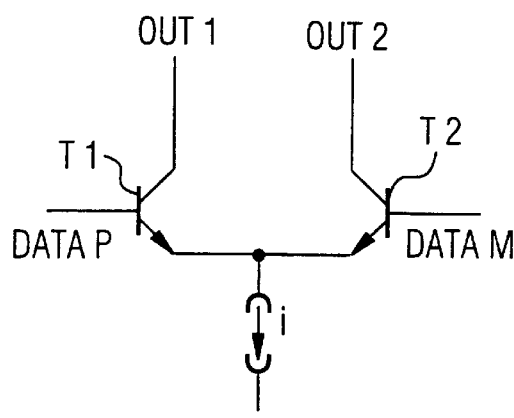
Figure 10B:
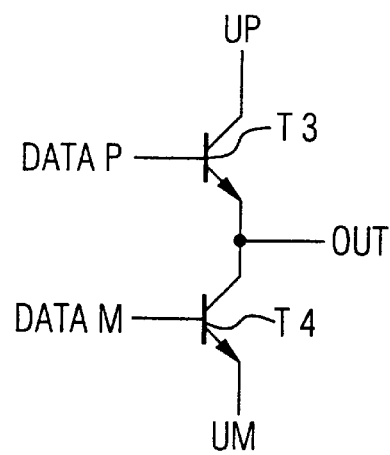

The known forms (shown in FIGS. 9A and 9B and also 10A and 10B) of the 1-bit digital-analog converters have already been described in the introduction.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

Figure 1:
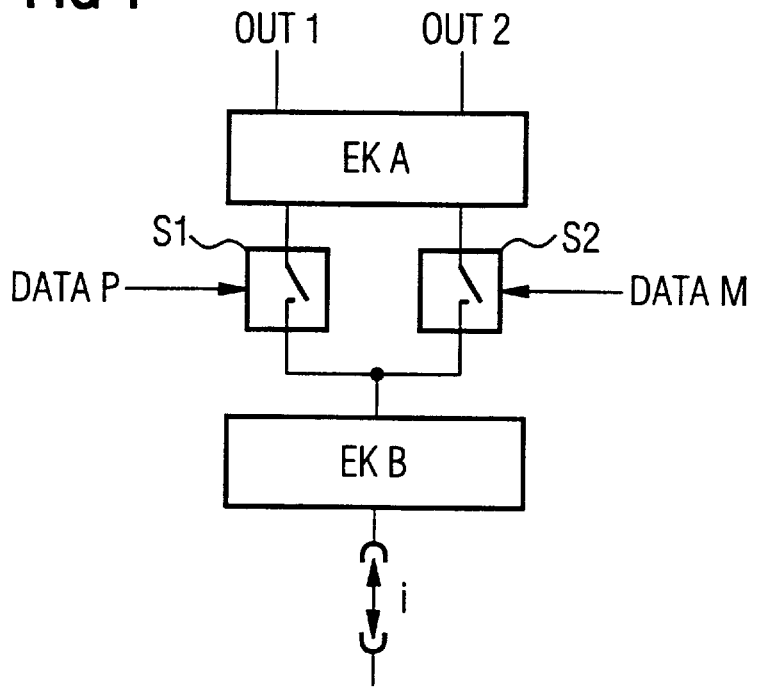
FIG. 1A shows the circuit diagram for a first embodiment of a 1-bit digital-analog converter for converting digital input values into current pulses.
Figure 2:
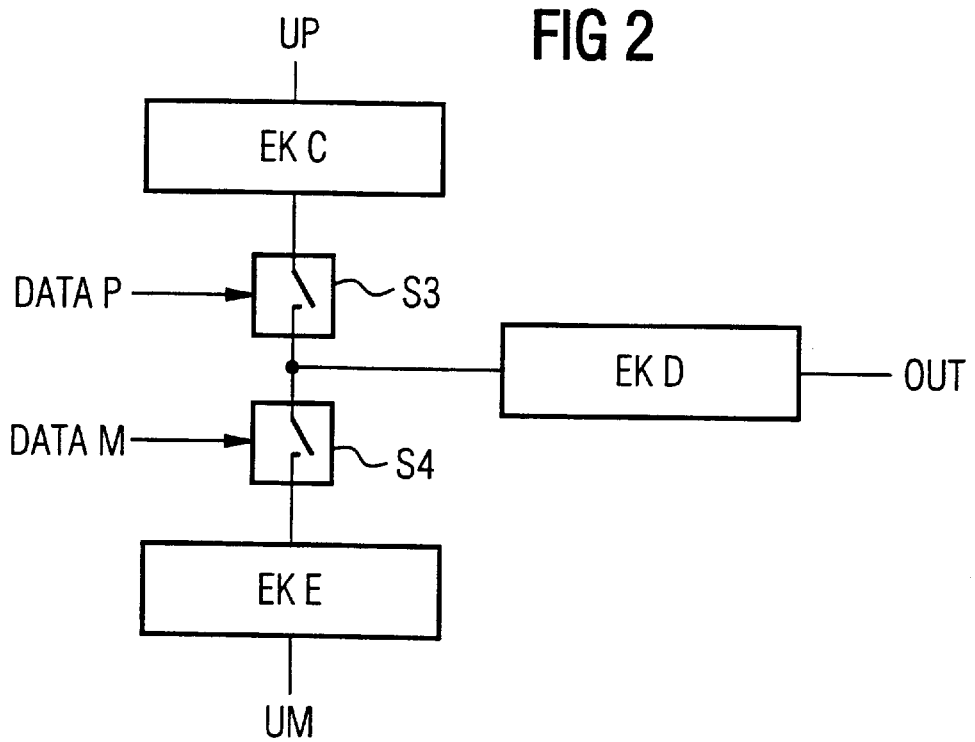
FIG. 2 shows the circuit diagram for a first embodiment of a 1-bit digital-analog converter for converting digital input values into voltage pulses.

FIGS. 1 and 2 show a schematic illustration of a first embodiment of the 1-bit digital-analog converter to convert digital information having the values "+1, −1" both into current (FIG. 1) and into voltage pulses (FIG. 2). The figures show data inputs DATAP, DATAM which are switched to a positive or negative output path OUT1, OUT2 of a differential current output or, in a design shown in FIG. 2, the voltage output OUT is switched to a voltage UP or UM, again under a control of the differential digital input signal DATAP, DATAM. In this case, switching units are symbolized by switches S1, S2 and S3, S4. To prevent interaction as a result of the components used not being ideal, the outputs, the switching units and pulse shaping units are decoupled from one another by special stages, shown in the circuit diagram in the form of decoupling units EKA, EKB, EKC, EKD and EKE, so that a converter function cannot be disrupted by interaction. Although, in reality, decoupling stages are also burdened by the fact that they are not ideal, and therefore do not fully conform to an ideal manner of operation, a sufficient degree of decoupling can be achieved with an appropriate level of effort, so that interaction is reduced. These decoupling units decouple the outputs from the switching level and, in turn, decouple the latter from the pulse shaping units.

Figure 3:
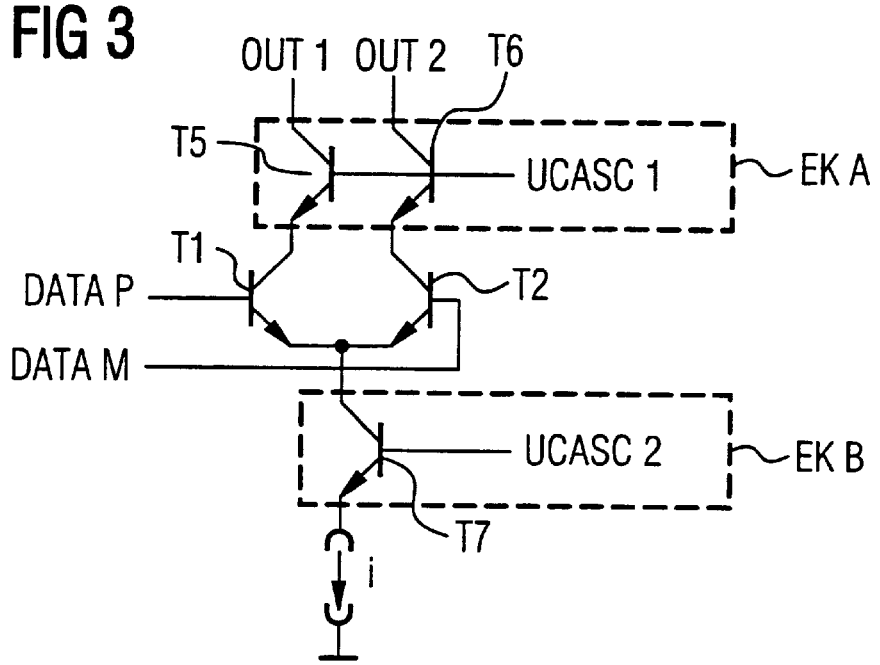
FIG. 3 shows a first implementation of the design shown in FIG. 1.

FIG. 3 shows one implementation of the circuit diagram for the 1-bit digital-analog converter in FIG. 1. In this case, the decoupling unit EKA is formed by an upper cascade level including two transistors T5 and T6, while the decoupling stage EKB is formed by a lower cascade level, including a transistor T7. The bases of the relevant transistors T5, T6 and T7 are biased by a corresponding voltage UCASC1 or UCASC2. The cascade isolation stage achieves the appropriate decoupling.

Figure 4:
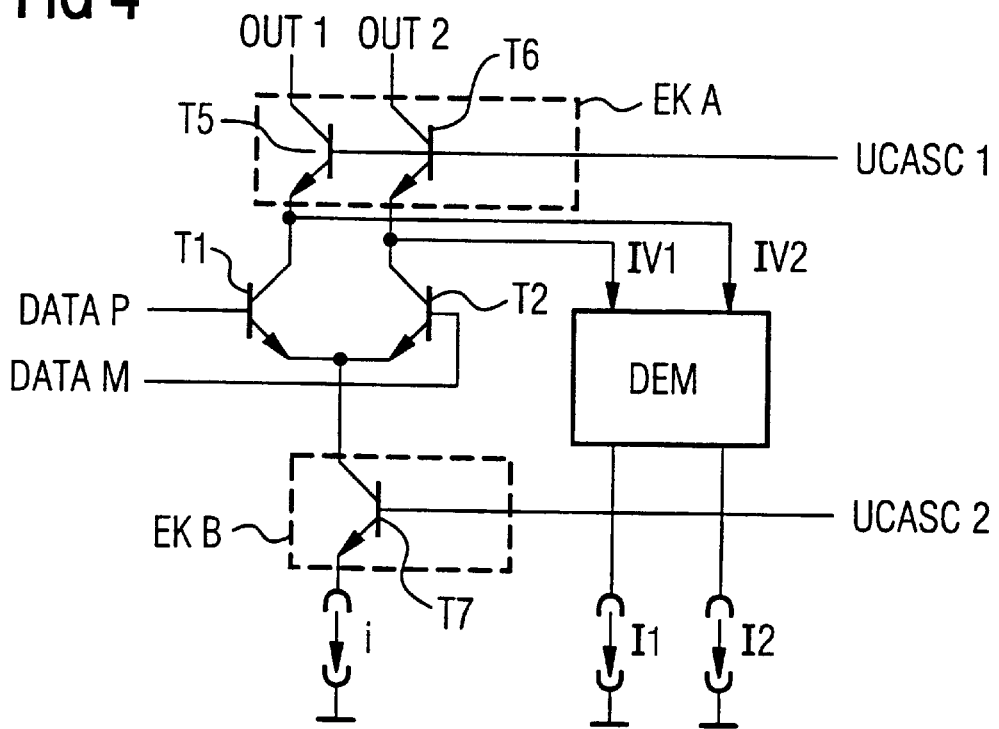
FIG. 4 shows a further development of the circuit shown in FIG. 3.

FIG. 4 shows a further development of the circuit produced by cascade isolation stages which is shown in FIG. 3, in which the upper cascade level, namely the decoupling stage EKA, is operated with bias current IV1 and IV2 in order to reduce the fluctuation in the collector voltage of the switching transistors T5 and T6 during the switching operation. Since the differences in the bias currents IV1, IV2 would result in considerable disruption of the converter, a "dynamic element matching" stage DEM has been provided which alternately changes over the constant currents I1 and I2 supplied to the dynamic element matching stage DEM. The effect achieved by this is that the bias currents IV1, IV2 through the two cascade transistors T5 and T6 have exactly the same value on average over time.

Such a dynamic element matching stage matches, when averaged over time, functional elements whose output states differ from one another. This is achieved by rhythmically transposing their operation. By way of example, output currents from four current sources which nominally deliver an identical output current are transposed at high frequency in order to equalize small differences between the output currents on the basis of a statistical mean. In this context, a boundary condition to be observed is that the frequency at which the interchange is effected does not restrict the effective useful spectrum.

FIGS. 5 and 6 show a schematic illustration of a second embodiment of the 1-bit digital-analog converter both for voltage operation (FIG. 5) and for current operation (FIG. 6). To ensure that the digital input bits "+1", "−1" are treated in the same way irrespective of the previous bits, each bit change fundamentally forces a switching operation, with a bit change being able to occur even without a change in the input bit, for example. For the duration of one bit, fundamentally, precisely one of the inputs DATAP1, DATAP2, DATAM1 and DATAM2 is at an "H" level and precisely three inputs are at an "L" level. If, by way of example, two digital input bits having the same value "+1" ("−1") now immediately succeed one another, the "H" level changes from DATAP1 to DATAP2 or from DATAP2 to DATAP1 (or, in the opposite case, from DATAM1 to DATAM2 or from DATAM2 to DATAM1), i.e. irrespective of the specific data signal sequence each bit change passes on the "H" level at one of the four digital inputs to another one. The advantage of this arrangement is that there is no longer any inherent asymmetry in the assessment of the input bit. This is achieved by arranging switching elements S3, S7 or S4, S8 and S1, S5 and also S6 and S2 in pairs. One implementation of such a circuit is shown in FIG. 7, in which the switches in FIG. 6, namely S1, S2, S5 and S6, are formed by transistors T1, T2 and also T9 and T10.

FIG. 8 shows the operation of a third embodiment of the invention. To explain the operation, the design of the known circuit shown in FIG. 9A is considered again in more detail. The way in which the circuit design works is based on a supplied current i (pulse shaping unit) being switched to the positive or negative output OUT1, OUT2 of a differential current output using a current switch S1, S2 on the basis of the polarity of the differential digital input signal DATAP, DATAM. In this context, the input current can assume a constant value (NRZ pulse) or else may have an already preshaped pulse shape. In this context, all previously known solutions have the property that, during the switching operation, the input current i has a magnitude which does not disappear. According to one aspect of the invention, the input current i is now controlled, during the switching operation, to a constant value which cannot be influenced by the data sequence, for example using an appropriate regulator (not shown), so that influences of the previous data bit can be precluded. In order, apart from this, to keep the switching transients which arise during the switching operation as small as possible, the current i is kept as small as possible or is turned off completely during the switching operation. This almost completely or fully precludes fluctuations in the input current i during the switching operation. Memory effects cannot arise. To eliminate a disruptive influence of the phase jitter during the data clock cycle relative to the clock cycle of the pulse-shaped input current i, it is necessary to ensure that the current i remains turned off for a sufficiently long period of time during the switching operation. The resulting pulse shape is shown in FIG. 8.

Figure 10A:
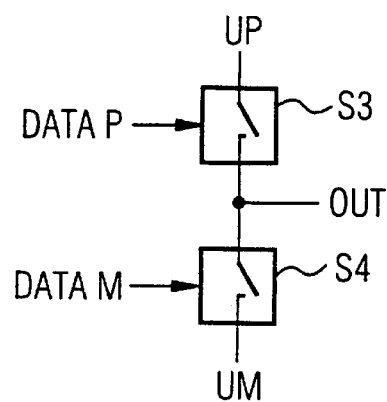
FIGS. 10A and 10B show a known circuit for a 1-bit digital-analog converter for converting digital information into voltage pulses.

Fundamentally, the principle can also be applied to the voltage circuit shown in FIG. 10A. In this case, it is necessary to ensure that, around the switching operation, no voltage differences arise between the output OUT and the input voltages UP and UM, or the voltage difference is kept constant.

The method explained for regulating the input current i to zero or virtually zero and the corresponding regulation of the voltage difference OUT-UP or OUT-UM can naturally likewise be applied to the other embodiments of a 1-bit digital-analog converter.

In addition, the embodiments illustrated above can be monolithically integrated, specifically can be used in the region of the base stations in the mobile communications sector, in base stations in the mobile multimedia sector and also in sigma-delta converters, which may be in the form of both digital-analog converters and analog-digital converters.

The invention has been described in detail with particular reference to preferred embodiments thereof and examples, but it will be understood that variations and modifications can be effected within the spirit and scope of the invention.

What is claimed is:

1. A 1-bit digital-analog converter comprising:
   two inputs;
   at least one output;
   at least one pulse shaping unit;
   switching units to selectively couple the at least one output to the at least one pulse shaping unit based on signals at the two inputs; and
   a decoupling unit formed by cascade isolation stages operated with a bias current to decouple the outputs, the switching units and the at least one pulse shaping unit from one another.

2. The 1-bit digital-analog converter as claimed in claim 1, wherein the cascade isolation stages are formed by transistors.

3. The 1-bit digital-analog converter as claimed in claim 1, further comprising:
   a dynamic element matching stage forming a bias current by alternate changeover of constant currents to operate the decoupling unit.

4. The 1-bit digital-analog converter as claimed in claim 2, further comprising:
   a dynamic element matching stage forming a bias current by alternate changeover of constant currents to operate the decoupling unit.

5. The 1-bit digital-analog converter as claimed in claim 1, wherein the at least one pulse shaping unit is a pair of voltage pulse shaping units producing voltages controlled where during a switching operation of the two inputs, a voltage difference between the voltages is a constant value not influenced by a data sequence.

6. The 1-bit digital-analog converter as claimed in claim 1, wherein the at least one pulse shaping unit is a current pulse shaping unit producing a current controlled where during a switching operation of the two inputs, the current is a constant value not influenced by a data sequence.

7. The 1-bit digital-analog converter as claimed in claim 1, wherein a monolithically integrated circuit comprises the 1-bit digital-analog converter.

8. The 1-bit digital-analog converter as claimed in claim 1, wherein a base station in the mobile communications sector or in the mobile multimedia sector comprises the 1-bit digital-analog converter.

9. The 1-bit digital-analog converter as claimed in claim 1, wherein a sigma-delta converter comprises the 1-bit digital-analog converter.

10. The 1-bit digital-analog converter as claimed in claim 1, wherein a digital-analog converter having a word length of at least two bits comprises the 1-bit digital-analog converter.

11. The 1-bit digital-analog converter as claimed claim 1, wherein a 1.5-bit digital-analog converter comprises the 1-bit digital-analog converter.

12. A 1-bit digital-analog converter comprising:
two pairs of inputs;
at least one output;
at least one pulse shaping unit;
two pairs of switching units controlled respectively by the two pairs of inputs, to selectively couple the at least one output to the at least one pulse shaping unit based on signals at the two pairs of inputs, where each change of an input bit forces a switching operation.

13. The 1-bit digital-analog converter as claimed in claim 12, wherein, one of the inputs is at an "H" level and three inputs are at an "L" level for a duration of one bit.

14. The 1-bit digital-analog converter as claimed in claim 13, wherein if two successive bits have the same value, one of the two pairs of inputs switches from an "H" level to an "L" level between the two successive bits.

15. The 1-bit digital-analog converter as claimed in claim 12, wherein the switching units are formed with transistors.

16. The 1-bit digital-analog converter as claimed in claim 13, wherein the switching units are formed with transistors.

17. The 1-bit digital-analog converter as claimed in claim 12, wherein the at least one pulse shaping unit is a pair of voltage pulse shaping units producing voltages controlled where during a switching operation of the two inputs, a voltage difference between the voltages is a constant value not influenced by a data sequence.

18. The 1-bit digital-analog converter as claimed in claim 12, wherein the at least one pulse shaping unit is a current pulse shaping unit producing a current controlled where during a switching operation of the two inputs, the current is a constant value not influenced by a data sequence.

19. The 1-bit digital-analog converter as claimed in claim 12, wherein a monolithically integrated circuit comprises the 1-bit digital-analog converter.

20. The 1-bit digital-analog converter as claimed in claim 12, wherein a base station in the mobile communications sector or in the mobile multimedia sector comprises the 1-bit digital-analog converter.

21. The 1-bit digital-analog converter as claimed in claim 12, wherein a sigma-delta converter comprises the 1-bit digital-analog converter.

22. The 1-bit digital-analog converter as claimed in claim 12, wherein a digital-analog converter having a word length of at least two bits comprises the 1-bit digital-analog converter.

23. The 1-bit digital-analog converter as claimed claim 12, wherein a 1.5-bit digital-analog converter comprises the 1-bit digital-analog converter.

24. A 1-bit digital-analog converter comprising:
two inputs;
at least one output;
a pulse shaping device comprising one of:
a pair of voltage pulse shaping units producing voltages controlled where during a switching operation of the two inputs, a voltage difference between the voltages is a constant value not influenced by a data sequence, and
a current pulse shaping unit producing a current controlled where during the switching operation of the two inputs, the current is a constant value not influenced by the data sequence; and
switching units performing the switching operation by selectively coupling the at least one output to the pulse shaping device based on signals at the two inputs.

25. The 1-bit digital-analog converter as claimed in claim 24, wherein
the pulse shaping device is the pair of voltage pulse shaping units, and
the pair of voltage pulse shaping units are controlled such that during the switching operation of the two inputs, the voltage difference between the voltages is substantially equal to zero.

26. The 1-bit digital-analog converter as claimed in claim 24, wherein
the pulse shaping device is the current pulse shaping unit, and
the current pulse shaping unit is controlled such that during the switching operation of the two inputs, the current is substantially equal to zero.

27. The 1-bit digital-analog converter as claimed in claim 24, wherein a monolithically integrated circuit comprises the 1-bit digital-analog converter.

28. The 1-bit digital-analog converter as claimed in claim 24, wherein a base station in the mobile communications sector or in the mobile multimedia sector comprises the 1-bit digital-analog converter.

29. The 1-bit digital-analog converter as claimed in claim 24, wherein a sigma-delta converter comprises the 1-bit digital-analog converter.

30. The 1-bit digital-analog converter as claimed in claim 24, wherein a digital-analog converter having a word length of at least two bits comprises the 1-bit digital-analog converter.

31. The 1-bit digital-analog converter as claimed claim 24, wherein a 1.5-bit digital-analog converter comprises the 1-bit digital-analog converter.

32. A 1-bit digital-analog converter, comprising:
two pairs of inputs;
an output;
a pulse shaping unit;
switching units to selectively couple the output to the pulse shaping unit based on signals at the two pairs of inputs; and
decoupling units to decouple the outputs, the switching units and the pulse shaping unit from one another, wherein the decoupling units and the switching units are formed as cascade isolation stages where at least one isolation stage is operated with a bias current.

* * * * *